(12) United States Patent
Xie et al.

(10) Patent No.: US 12,087,770 B2
(45) Date of Patent: Sep. 10, 2024

(54) COMPLEMENTARY FIELD EFFECT TRANSISTOR DEVICES

(71) Applicant: International Business Machines Corporation, Armonk, NY (US)

(72) Inventors: Ruilong Xie, Niskayuna, NY (US); Julien Frougier, Albany, NY (US); Heng Wu, Guilderland, NY (US); Chen Zhang, Guilderland, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 17/394,701

(22) Filed: Aug. 5, 2021

(65) Prior Publication Data

US 2023/0038957 A1    Feb. 9, 2023

(51) Int. Cl.
| | | |
|---|---|---|
| *H01L 27/092* | (2006.01) |
| *H01L 21/822* | (2006.01) |
| *H01L 21/8238* | (2006.01) |
| *H01L 27/06* | (2006.01) |
| *H01L 29/06* | (2006.01) |
| *H01L 29/66* | (2006.01) |
| *H01L 29/775* | (2006.01) |

(52) U.S. Cl.
CPC ........ *H01L 27/092* (2013.01); *H01L 21/8221* (2013.01); *H01L 21/823871* (2013.01); *H01L 27/0688* (2013.01); *H01L 29/0673* (2013.01); *H01L 29/66439* (2013.01); *H01L 29/775* (2013.01)

(58) Field of Classification Search
CPC ............... H01L 27/092; H01L 27/0688; H01L 21/8221; H01L 21/823807; H01L 21/82385; H01L 21/823871; H01L 21/823878; H01L 29/775
See application file for complete search history.

(56) References Cited

U.S. PATENT DOCUMENTS

| | | |
|---|---|---|
| 6,847,808 B2 | 1/2005 | Zhou |
| 9,659,963 B2 | 5/2017 | Cheng |
| 9,837,414 B1 | 12/2017 | Balakrishnan |
| 10,192,819 B1 | 1/2019 | Chanemougame |
| 10,192,867 B1 | 1/2019 | Frougier |
| 10,256,158 B1 | 4/2019 | Frougier |
| 10,304,833 B1 | 5/2019 | Suvarna |

(Continued)

FOREIGN PATENT DOCUMENTS

| | | |
|---|---|---|
| AU | 758341 B2 | 3/2003 |
| CN | 111584486 A | 8/2020 |

(Continued)

OTHER PUBLICATIONS

International Search Report and Written opinion dated Jul. 27, 2022 from International Application No. PCT/CN2022/096203 filed May 31, 2022.

*Primary Examiner* — Michael M Trinh
(74) *Attorney, Agent, or Firm* — David K. Mattheis

(57) ABSTRACT

A complementary metal-oxide semiconductor device formed by fabricating CMOS nanosheet stacks, forming a dielectric pillar dividing the CMOS nanosheet stacks, forming CMOS FET pairs on either side of the dielectric pillar, and forming a gate contact for at least one of the FETs.

8 Claims, 14 Drawing Sheets

(56) References Cited

U.S. PATENT DOCUMENTS

| | | | |
|---|---|---|---|
| 10,388,519 | B2 | 8/2019 | Smith |
| 10,418,449 | B2 | 9/2019 | Paul |
| 10,818,674 | B2 | 10/2020 | Mann |
| 10,833,168 | B2 | 11/2020 | Seo |
| 10,916,544 | B2 | 2/2021 | Xiao |
| 10,964,706 | B2 | 3/2021 | Smith |
| 10,991,626 | B2 | 4/2021 | Smith |
| 2016/0020305 | A1 | 1/2016 | Obradovic |
| 2017/0323952 | A1* | 11/2017 | Cheng ............... H01L 21/02271 |
| 2019/0172828 | A1* | 6/2019 | Smith ............... H01L 21/28088 |
| 2019/0229021 | A1* | 7/2019 | Ando .................... H01L 29/775 |
| 2020/0051981 | A1 | 2/2020 | Yang |
| 2020/0286900 | A1* | 9/2020 | Mann ................ H01L 29/78696 |
| 2021/0104523 | A1 | 4/2021 | Fulford |
| 2021/0125986 | A1 | 4/2021 | Vellianitis |
| 2021/0202500 | A1* | 7/2021 | Chanemougame .......................... H01L 29/78696 |
| 2021/0296315 | A1* | 9/2021 | Lilak ................. H01L 29/66439 |
| 2022/0109046 | A1* | 4/2022 | Hong ............. H01L 21/823871 |

FOREIGN PATENT DOCUMENTS

| | | |
|---|---|---|
| EP | 1796202 B1 | 7/2013 |
| WO | 1999039432 A1 | 8/1999 |
| WO | 2015190852 A1 | 12/2015 |
| WO | 2019132886 A1 | 7/2019 |
| WO | 2023010980 A1 | 2/2023 |

\* cited by examiner

COMPLEMENTARY FIELD EFFECT TRANSISTOR DEVICES

BACKGROUND

The disclosure relates generally to complementary field effect transistor (CFET) devices. The disclosure relates particularly to stacked CFET pairs having a reduced architectural footprint.

Integrated circuit (IC) chips are formed on semiconductor wafers at increasingly smaller scale. In current technology nodes, transistor devices are constructed as three-dimensional (3D) field effect transistor (FET) structures.

Complementary metal-oxide semiconductor (CMOS) devices include pairs of field effect transistors (FET), an n-type FET and a p-type FET, differentiated by the nature of the elemental dopants used in their fabrication, and the resulting electrical properties.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a complementary metal-oxide semiconductor device formed by fabricating CMOS nanosheet stacks, forming a dielectric pillar dividing the CMOS nanosheet stacks, forming CMOS FET pairs on either side of the dielectric pillar, and forming a gate contact for at least one of the FETs.

In one aspect, a complementary metal-oxide semiconductor (CMOS) device includes a stacked pair of nanosheet field effect transistors (FET), the stacked pair comprising a first nanosheet device disposed above a second nanosheet device, a dielectric spacer disposed adjacent to an edge of the stacked pair, and a third FET disposed adjacent to the dielectric spacer and opposite to the stacked pair.

In one aspect, a complementary metal-oxide semiconductor (CMOS) device includes a stacked pair of CMOS field effect transistors (FET), the stacked pair comprising independent source/drain contacts, a dielectric spacer disposed adjacent to an edge of the stacked pair, and a third FET disposed adjacent to the dielectric spacer and opposite to the stacked pair.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
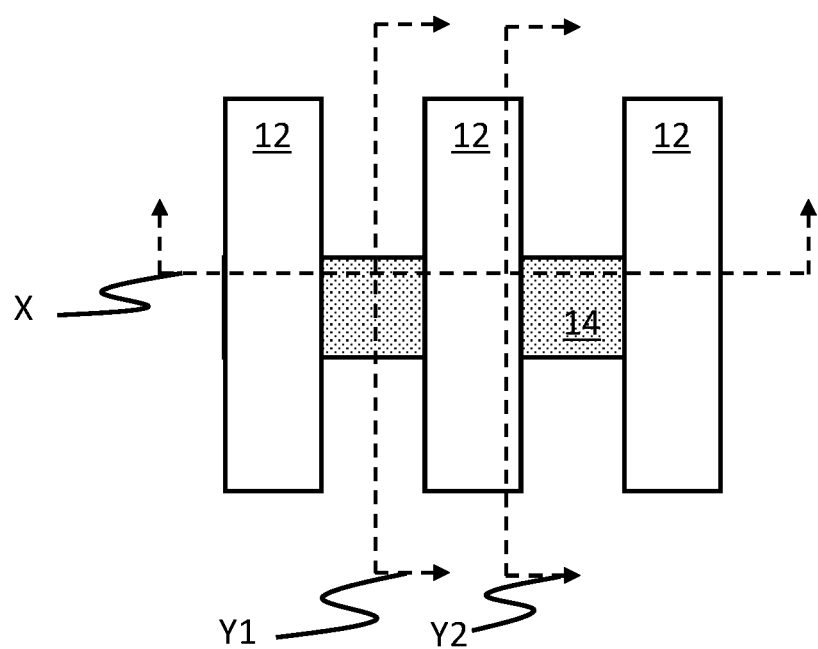
FIG. 1 provides a schematic plan view of a device according to an embodiment of the invention. The figure illustrates the section lines associated with the views of FIGS. 2-13.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Integrated circuit (IC) chips are formed on semiconductor wafers at increasingly smaller scale. In current technology nodes, transistor devices are constructed as three-dimensional (3D) field effect transistor (FET) structures. However, chipmakers face a myriad of challenges at 5 nm, 3 nm and beyond. Currently, chip scaling continues to slow as process complexities and costs escalate at each node. Disclosed embodiments enable reduced footprints for CMOS device architectures through the formation of pairs CMOS devices from a single stack of nanosheet layers grown upon an underlying substrate.

Reference is now made to the figures. The figures provide schematic cross-sectional illustration of semiconductor devices at intermediate stages of fabrication, according to one or more embodiments of the invention. The figures provide a front cross-section taken along section line X of FIG. 1, and a side cross-section taken along section line Y1 of the plan view of FIG. 1. The device provide schematic representations of the devices of the invention and are not to be considered accurate or limiting with regards to device element scale.

FIG. 1 provides a plan view of two CFET device pairs after fabrication steps disclosed herein. As shown in the Figure, gate structures 12, are disposed perpendicular to nanosheet stack 14. Section lines X, Y1, and Y2, indicate the viewpoints of the respective views of FIGS. 2-13.

Figure 2:
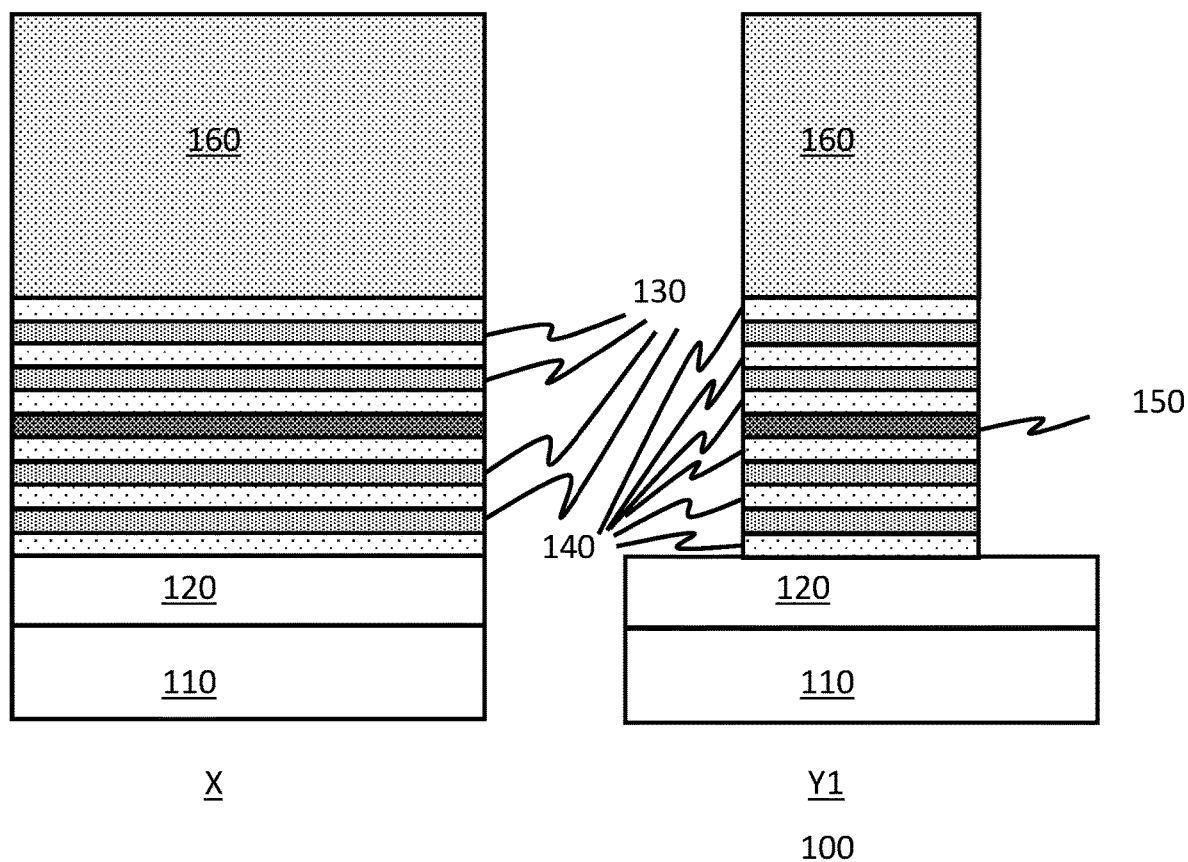
FIG. 2 provides a cross-sectional view of a step in the fabrication of a semiconductor device, according to an embodiment of the invention. The figure illustrates a stack of epitaxially grown nanosheet layers and a protective hardmask layer.

FIG. 2 provides a schematic view of a device 100 according to an embodiment of the invention following the deposition, patterning, and selective removal of a stack of layers for the formation of CFET device nanosheets. In an embodiment, the stack includes alternating layers of epitaxially grown silicon germanium 140, 150, and silicon 130. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack includes a bottom-most layer 140 and a top-most layer 140 of a first semiconductor material, such as SiGe and an intervening layers 130 of a second semiconductor material, such as Si. The nanosheet stack is depicted with eleven layers (three SiGe layers and two Si layers forming a lower device, three SiGe layers and two Si layers forming an upper device, and a high Ge concertation, e.g., 50%-70% Ge, SiGe layer 150, separating the upper and lower device layer sets), however any number and combination of layers can be used so long as the layers alternate between SiGe and Si to form lower and upper devices and include a high Ge concentration SiGe layer separating the lower and upper devices. The nanosheet stack is depicted with the layers being in the form of nanosheets, however the width of any given nanosheet layer can be varied so as to result in the form of a nanowire, a nanoellipse, a nanorod, etc. SiGe layers 140, 150, can be composed of, for instance, $SiGe_{20\text{-}60}$, examples thereof including, but not limited to $SiGe_{20}$, $SiGe_{25}$, $SiGe_{30}$ . . . $SiGe_{65}$.

Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). An insulating layer 120 may be present on substrate 110 and, if present, is located between substrate 110 and the nanosheet stack. Insulating layer 120 can be, for example, a buried oxide layer (typically $SiO_2$) or a bottom dielectric isolation layer formed early in the process (typically SiN, SiBCN, SiOCN, SiOC, or any combination of low-k materials).

In an embodiment, each sacrificial semiconductor material layer 140 and 150, is composed of a first semiconductor material which differs in composition from at least an upper portion of the semiconductor substrate 110. In one embodiment, the upper portion of the semiconductor substrate 110 is composed of silicon, while each sacrificial semiconductor material layers 140 and 150 is composed of a silicon germanium alloy. In such an embodiment, the SiGe alloy that provides each sacrificial semiconductor material layer 150 has a germanium content that is greater than 50 atomic percent germanium. In one example, the SiGe alloy that provides each sacrificial semiconductor material layer 150 has a germanium content from 50 atomic percent germanium to 70 atomic percent germanium. In such an embodiment, the SiGe alloy that provides each sacrificial semiconductor material layer 140 has a germanium content that is less than 50 atomic percent germanium. In one example, the SiGe alloy that provides each sacrificial semiconductor material layer 140 has a germanium content from 20 atomic percent germanium to 40 atomic percent germanium. The first semiconductor material that provides each sacrificial semiconductor material layers 140 and 150 can be formed utilizing an epitaxial growth (or deposition process).

Each semiconductor channel material layer 130, is composed of a second semiconductor material that has a different etch rate than the first semiconductor material of the sacrificial semiconductor material layers 140 and 150 and is also resistant to Ge condensation. The second semiconductor material of each semiconductor channel material layer 130, may be the same as, or different from, the semiconductor material of at least the upper portion of the semiconductor substrate 110. The second semiconductor material can be a SiGe alloy provided that the SiGe alloy has a germanium content that is less than 50 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 140, 150 is composed of a silicon germanium alloy. The second semiconductor material of each semiconductor channel material layer 130, can be formed utilizing an epitaxial growth (or deposition process).

In an embodiment, hardmask 160 is deposited above the stack of nanosheet layers 130-150. In this embodiment, hardmask 160 includes a nitride, oxide, an oxide-nitride bilayer, or another suitable material. In some embodiments, the hardmask 160 may include an oxide such as silicon oxide (SiO), a nitride such as silicon nitride (SiN), an oxynitride such as silicon oxynitride (SiON), combinations thereof, etc. In some embodiments, the hardmask 160 is a silicon nitride such as $Si_3N_4$.

Following deposition of the stack of layers 130, 140, 150, and 160 across the surface of the device die, the layers are patterned using a process such as lithographic masking, and selectively etched yielding a pattern of device fins including stacks of upper and lower device nanosheets separated by sacrificial layers of semiconductor materials, which defines the active region of the devices, and protected above by hardmask layer 160.

Figure 3:
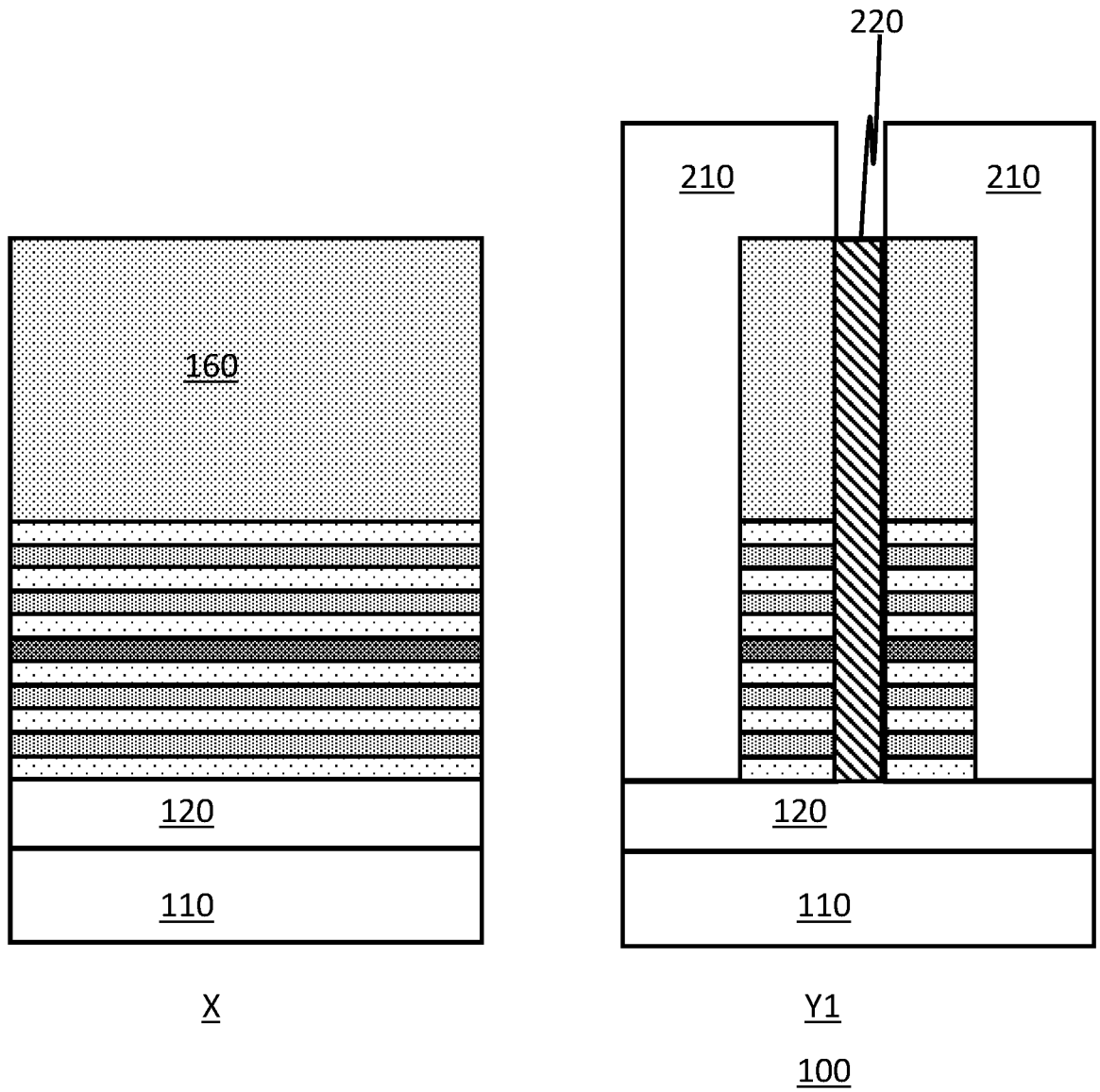
FIG. 3 provides a cross-sectional view of a step in the fabrication of a semiconductor device, according to an embodiment of the invention. The figure illustrates the device after the formation of a dielectric spacer through the stack of nanosheet layers.

FIG. 3 illustrates device 100 following the formation of dielectric spacer 220. As shown in the figure, a protective mask 210, such as an organic planarization layer (OPL), is disposed around and above the nanosheet stacks and hardmask 160. A trench is then etched through the hardmask 160 and nanosheet stacks using Reactive ion etching (RIE) or similar methods, to the upper surface of insulating layer 120. In an embodiment, spacer material 220 may be comprised of any one or more of a variety of different insulative materials, such as $Si_3N_4$, SiBCN, SiNC, SiN, SiCO, $SiO_2$, SiNOC, etc. In an embodiment, dielectric spacer 220 can be formed by conformally depositing dielectric material into the trench, followed by etching back the dielectric film such that OPL 210 and hardmask 160 are revealed. In this manner the fabrication defines the active regions for two CFET pairs which are isolated by a dielectric spacer 220. In an embodiment, by shrinking the trench width, the two CFET pairs can be formed very close to each other (with less than about 25 nm space between the pairs).

Figure 4:
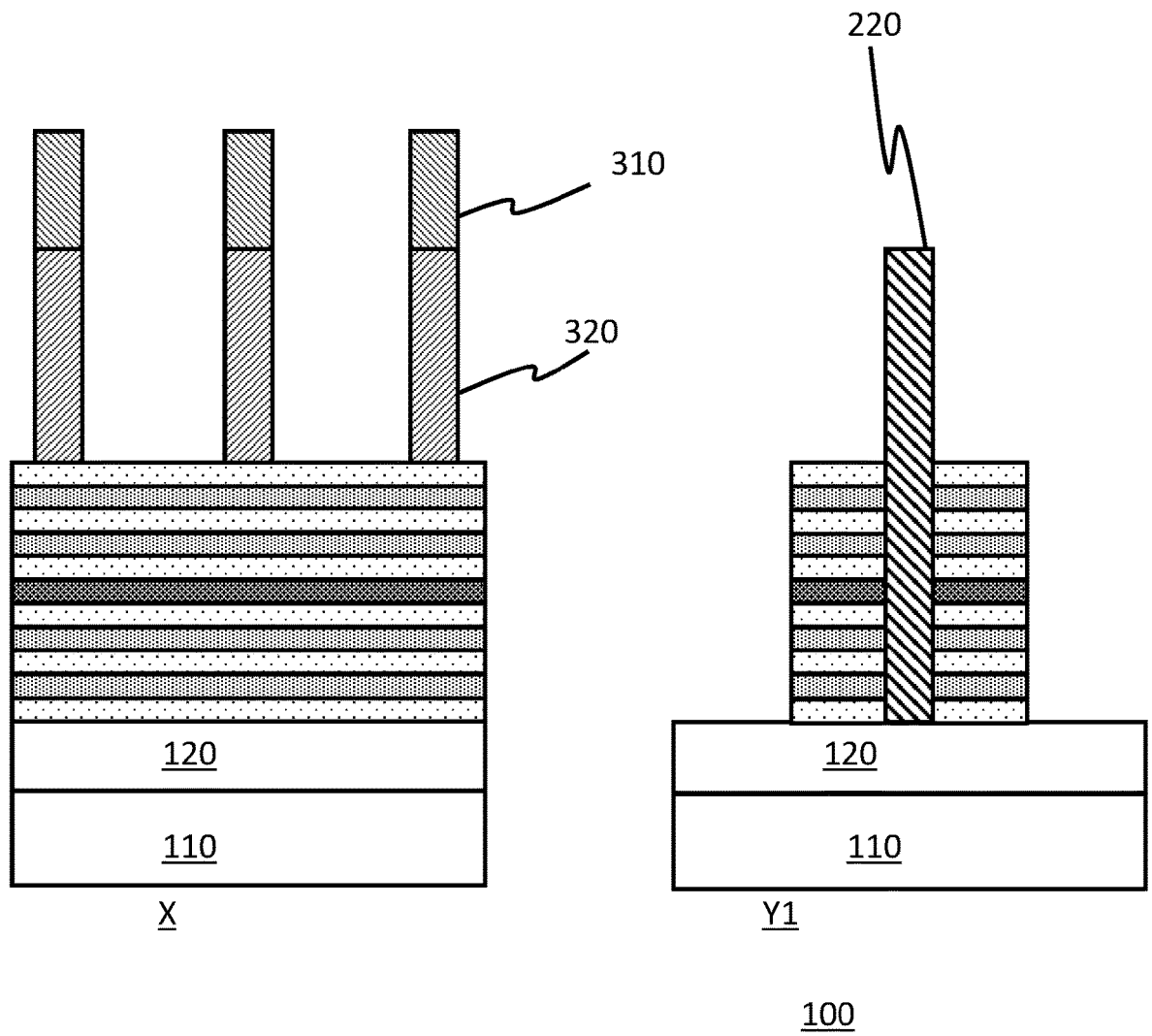
FIG. 4 provides a cross-sectional view of a step in the fabrication of a semiconductor device, according to an embodiment of the invention. The figure illustrates the device after the formation of dummy gate structures.

FIG. 4 illustrates device 100 following removal of the OPL and hard mask 160 from the device. The Figure further shows the device following fabrication of dummy gate structures including dummy gates 320, and sacrificial caps 310. Formation of dummy gate structures includes the deposition and subsequent patterning the sacrificial cap and dummy gate layers. Three dummy gates are shown however any number of gates can be formed. Dummy gate structures can be formed by depositing a dummy gate material 320 over the nanosheet stack. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The dummy gate material can be, for example, a thin layer of oxide, followed by polycrystalline silicon, amorphous silicon or microcrystal silicon. After that, a hardmask sacrificial cap layer 310, is deposited over the dummy gate, followed by lithographic masking and etch processes.

Figure 5:
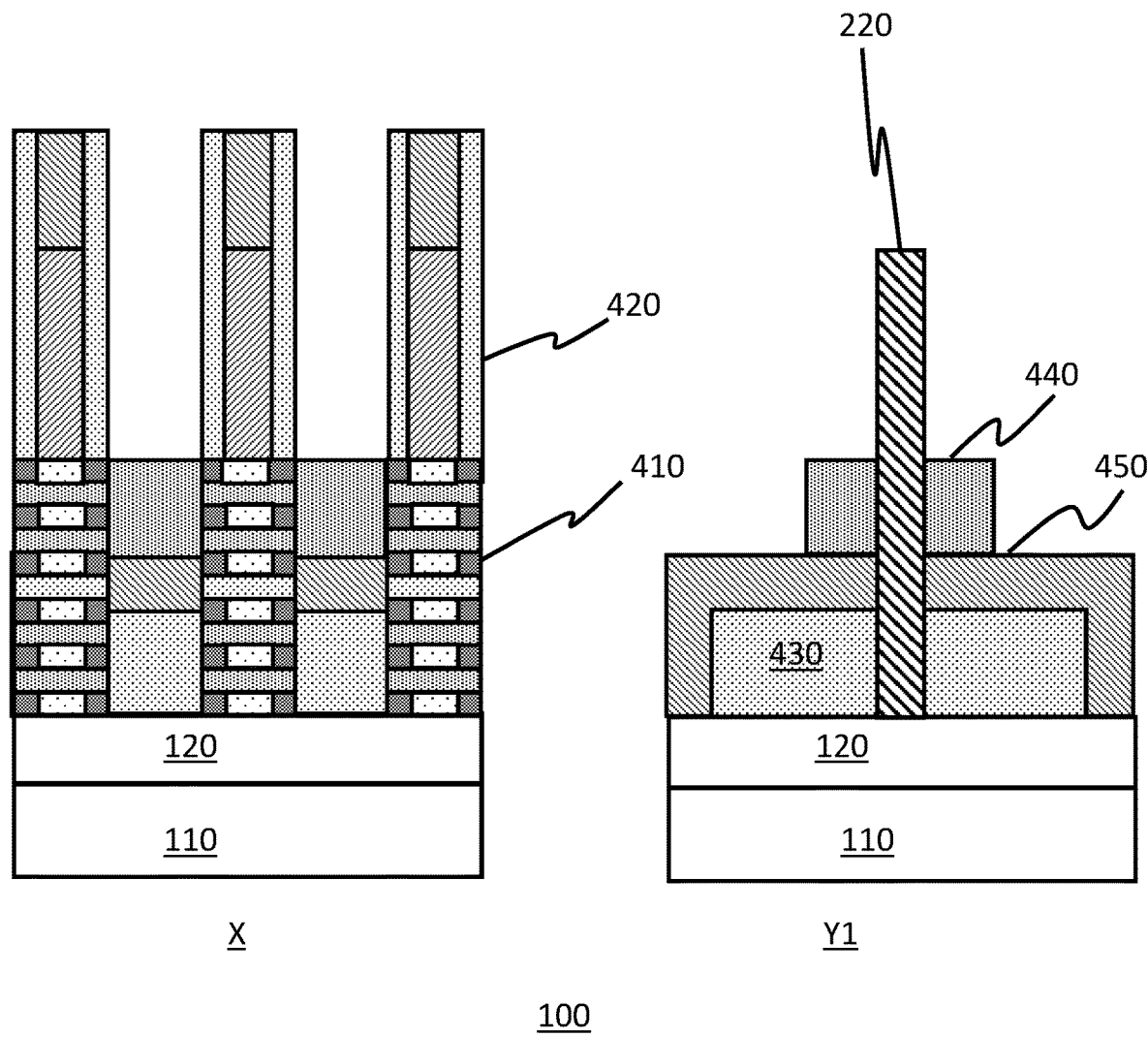
FIG. 5 provides a cross-sectional view, of a step in the fabrication of a semiconductor device, according to an embodiment of the invention. The figure illustrates the device the epitaxial growth of CFET source/drain regions.

FIG. 5 illustrates device 100 following formation of CFET device stacks and growth of device source/drain regions 430, 440, separated by a dielectric material 450. The Figure further illustrates the formation of gate sidewall spacer 420, adjacent to the dummy gates, as well as inner spacers 410, between channel nanosheets of the upper and lower FET devices of the CMOS stacks.

FIG. 5 illustrates device 100 following selective removal of sacrificial layer 150 separating the upper and lower FET devices of the CFET. In an embodiment, the high Ge concentration SiGe of layer 150 may be selectively etched away without removal of sacrificial layers 140, or channel layers 130, due to the higher concentration of Ge of sacrificial layer 150 compared to sacrificial layers 140, or channel layers 130.

FIG. 5 illustrates device 100 following conformal deposition and selective etching of spacer materials to fill the void left by removal of layer 150. Spacer material 420 further forms sidewall spacers along the sidewalls of dummy gate structure 320 and hardmask 310. In an embodiment, spacer material 420 may be the same material as hardmask 160, or may be different materials and may be comprised of any one or more of a variety of different insulative materials, such as $Si_3N_4$, SiBCN, SiNC, SiN, SiCO, $SiO_2$, SiNOC, etc. In this embodiment, after conformal deposition, selective etching, such as anisotropic reactive ion etching, removes spacer material 420 from horizontal surfaces of the intermediate stage of the device 100.

FIG. 5 further illustrates device 100 following recessing the nanosheet stack layers 130, 140, and spacer layer 420, to form the S/D cavities for CFET devices. FIG. 5 illustrates device 100 following formation of inner spacers 410 between nanosheets of the respective FET devices. Portions of nanosheet stack layers 130, 140, and spacers 420, which are not underneath gate spacers 420 and not underneath dummy gate 320 are removed.

Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

After generally etching the nanosheet stack to the cross section of the dummy gate and sidewall gate spacers 420, a selective etching of SiGe layers 140 of the nanosheet stack removes portions which are underneath gate spacers 420. Inner spacers 410 are then formed in etched portions and thus are located under gate spacers 420. Inner spacers 410 can be composed of any suitable dielectric material, for example $Si_3N_4$, SiBCN, SiNC, SiN, SiCO, $SiO_2$, SiNOC, etc. The inner spacer is formed by a conformal dielectric liner deposition followed by isotropic etching back, so dielectric liner is removed everywhere except the regions pinched-off in those under spacer cavities.

FIG. 5 illustrates device 100 following epitaxial growth of source/drain regions for the lower FET device and the upper FET device of the CFET. In an embodiment, boron doped SiGe (SiGe:B) is epitaxially grown from exposed semiconductor surfaces (layers 130). The epitaxially grown material is grown not only over the bottom device, but also top devices, and the material is purposely grown high to also yield a large amount of lateral growth in the Y direction. After growth is completed, the epitaxy grown over the top channels needs to be removed. The SiGe:B is then recessed to a level in contact with nanosheets 130 of the lower FET device. After that, a lithographic patterning and etch process is used to remove unwanted portion of the bottom epitaxial growth. In an embodiment, this yields source/drain regions 430, for the lower pFET device of the CFET.

As shown in FIG. 5, dielectric material 450, such as SiCO, around and above lower source/drain regions 430. Chemical-mechanical planarization (CMP) processes applied to dielectric 450 yields a polished surface followed by dielectric recess to the level desired for growth of upper source/drain regions 440.

FIG. 5 also illustrates device 100 following epitaxial growth, patterning and selective removal of upper device S/D regions 440. In an embodiment, epitaxial growth of phosphorous doped Si (Si:P) provides S/D regions for nFET devices of the CFET. S/D regions 440 contact nanosheet layers 130 of the upper FET device. Epitaxial growth of upper source/drain regions starts from the upper nanosheets 130. Growth is not as extensive as that for the lower source/drain regions 430, as the upper S/D regions 440 do not require as much lateral growth as lower S/D regions 430.

The disclosed example provides for the fabrication of a CFET device having an upper nFET and a lower pFET. In an embodiment, the CFET includes an upper pFET and a lower nFET. In this embodiment, the appropriate doping of the upper and lower S/D regions results in the desired pattern of nFET and pFET for the CFET device.

In the present embodiments, the source/drain regions 430, 440, may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. In an embodiment, the upper S/D regions of the device comprise n-type material and the lower regions comprise p-type materials. In an embodiment, the upper S/D regions comprise p-type materials and the lower regions comprise n-type materials.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 440, 450 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 6:
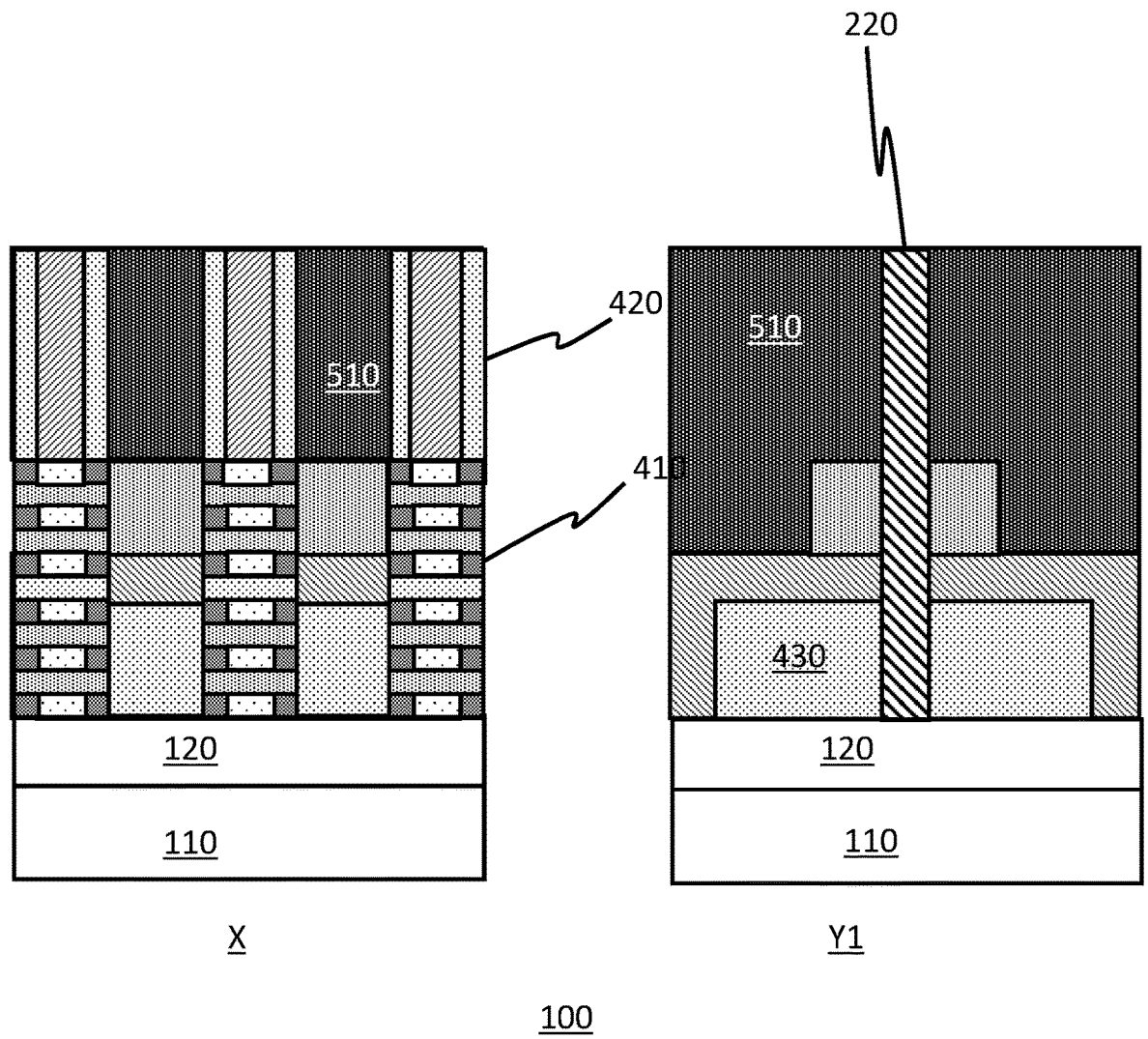
FIG. 6 provides a cross-sectional view of a step in the fabrication of a semiconductor device, according to an embodiment of the invention. The figure illustrates the device after the deposition of interlayer dielectric material around the CFET devices.

FIG. 6 illustrates device 100 following deposition and CMP of interlayer dielectric (ILD) 510. Exemplary ILD materials include SiO2, SiN, SiOC, low-k dielectric (k<3.9), and combinations thereof. As shown in the Figure, CMP of device 100 recesses ILD 510 and dielectric spacer 220, to the upper surface of dummy gate 320.

Figure 7:
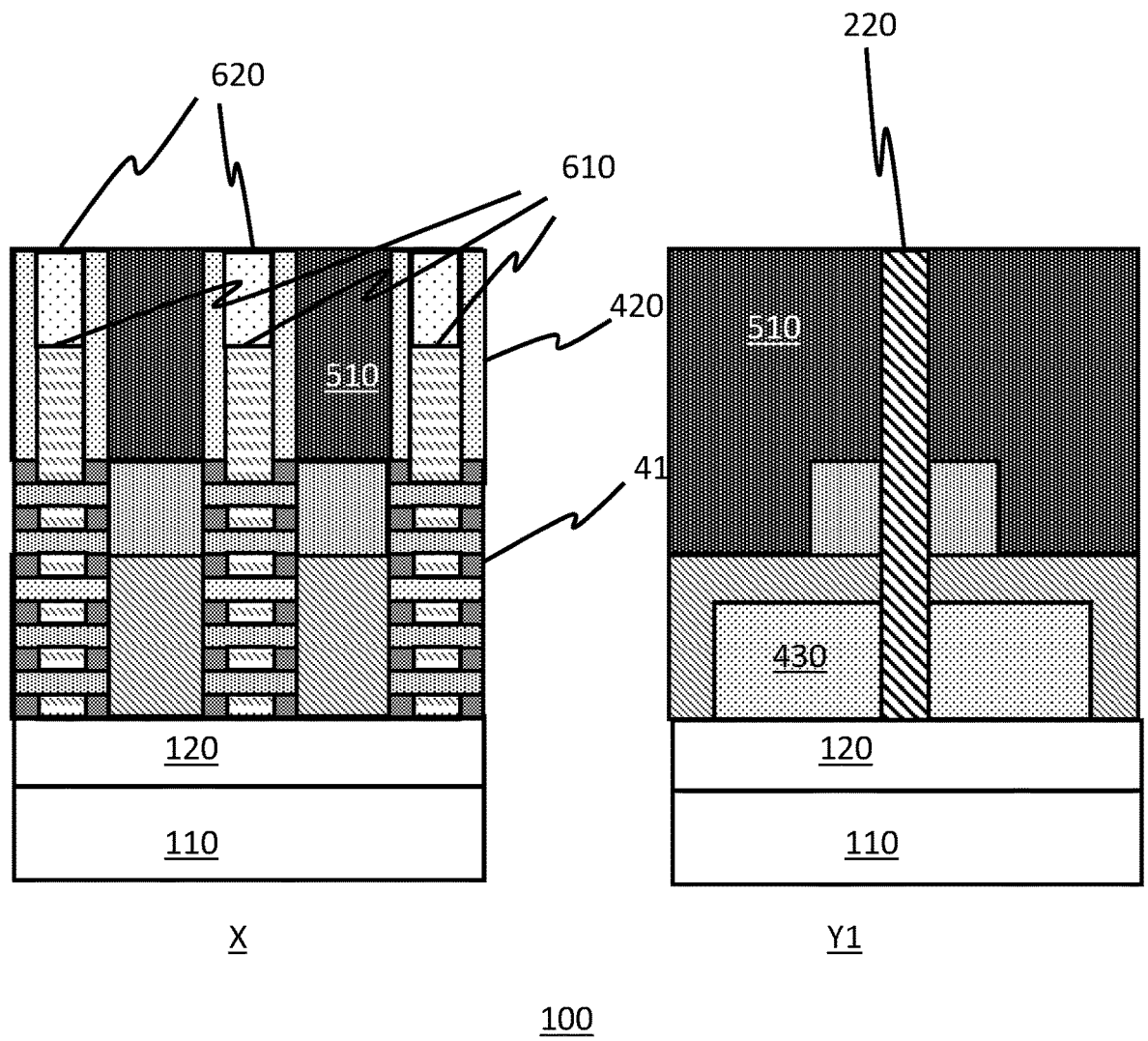
FIG. 7 provides a cross-sectional view of a step in the fabrication of a semiconductor device, according to an embodiment of the invention. The figure illustrates the device after the formation of replacement metal gate structures.

FIG. 7 illustrates device 100 following the removal of dummy gate 320, sacrificial SiGe 140, and formation of the high-k metal gate (HKMG) stack 610, and a protective gate dielectric cap 620. As shown in the Figure, a replacement metal gate structure has been formed in the void space created by removal of the dummy gate 320, hardmask 310, and sacrificial SiGe 140. Gate structure 610 includes gate dielectric and gate metal layers (not shown). The gate dielectric is generally a thin film and can be silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gate 610 may be formed via known deposition techniques, such as atomic layer deposition, chemical vapor deposition, or physical vapor deposition. It should be appreciated that a chemical mechanical planarization (CMP) process can be applied to the top surface.

In an embodiment, the replacement metal gate 610 includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by the deposition and CMP of a gate dielectric material 620, to complete the replacement metal gate fabrication stage for the device.

Figure 8:
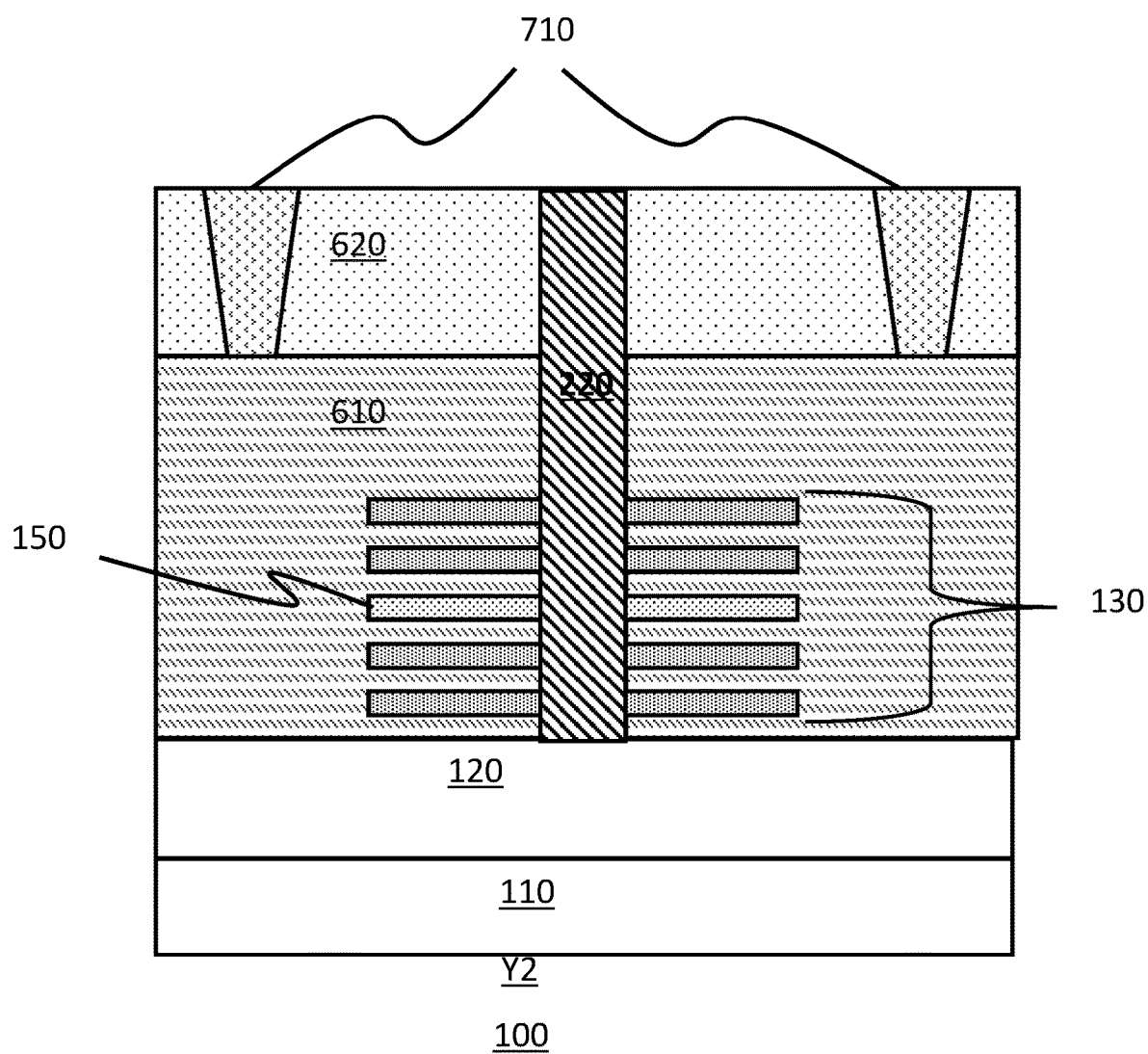
FIG. 8 provides a cross-sectional view of a step in the fabrication of a semiconductor device, according to an embodiment of the invention. The figure illustrates the device after the formation of common gate contacts.

FIG. 8 illustrates a sectional view of device 100 along section line Y2, of FIG. 1. This section line is taken through the HKMG portion of the device. As shown in the Figure, gate contacts 710, fill vias through protective cap material 620, to connect with HKMG material 610. Channel nanosheets 130 form upper and lower FET devices above and below spacer layer 150. Two pairs of CMOS nFET/pFET stacks are formed, separated by dielectric spacer 220 of the device. Each CMOS pair shares a common gate contact 710.

Figure 9:
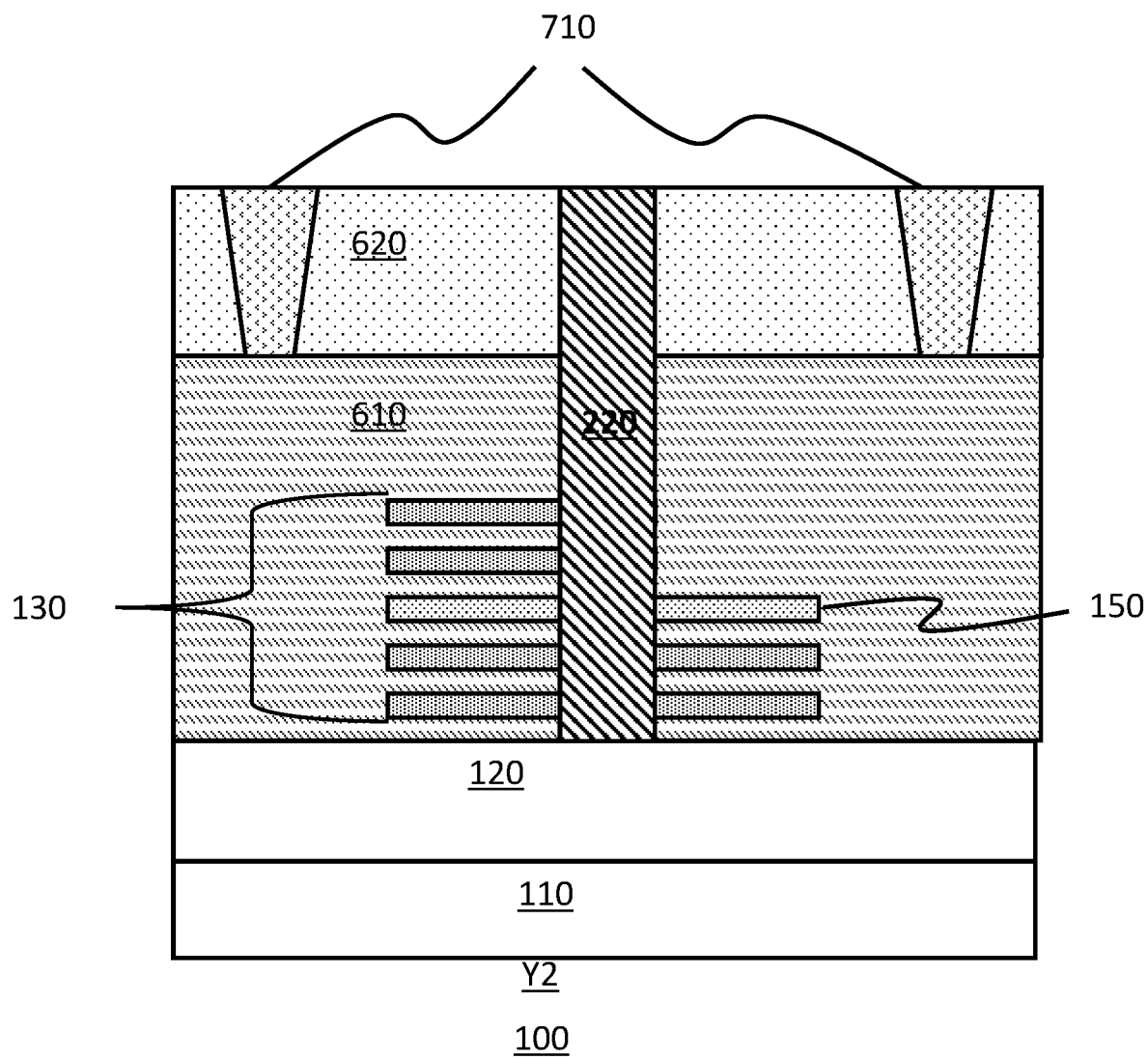
FIG. 9 provides a cross-sectional view of a step in the fabrication of a semiconductor device, according to an embodiment of the invention. The figure illustrates the gate contacts for a CFET/unipolar device combination.

FIG. 9 illustrates a sectional view of device 100 along section line Y2, of FIG. 1, according to an alternative embodiment of the invention. This section line is taken through the HKMG portion of the device. As shown in the Figure, gate contacts 710, fill vias etched through protective cap material 620, to connect with HKMG material 610. Channel nanosheets 130 form upper and lower FET devices above and below spacer layer 150 on the left side of the illustrated device. One pair of CMOS nFET/pFET stack is formed, separated by dielectric spacer 220 of the device from a single FET formed below spacer 150 on the right side of spacer 220 of the device. Each side of the device 100 has a single gate contact 710. Formation of the single FET includes removing the upper channel layers 130, and sacrificial layers 140, on the right side of the structure. In an embodiment, removal of these layers occurs following the deposition of ILD material 510, or following removal of dummy gate 320, prior to the formation of the HKMG structure. The layers are removed through masking and selective etching of the layer materials.

Figure 10:
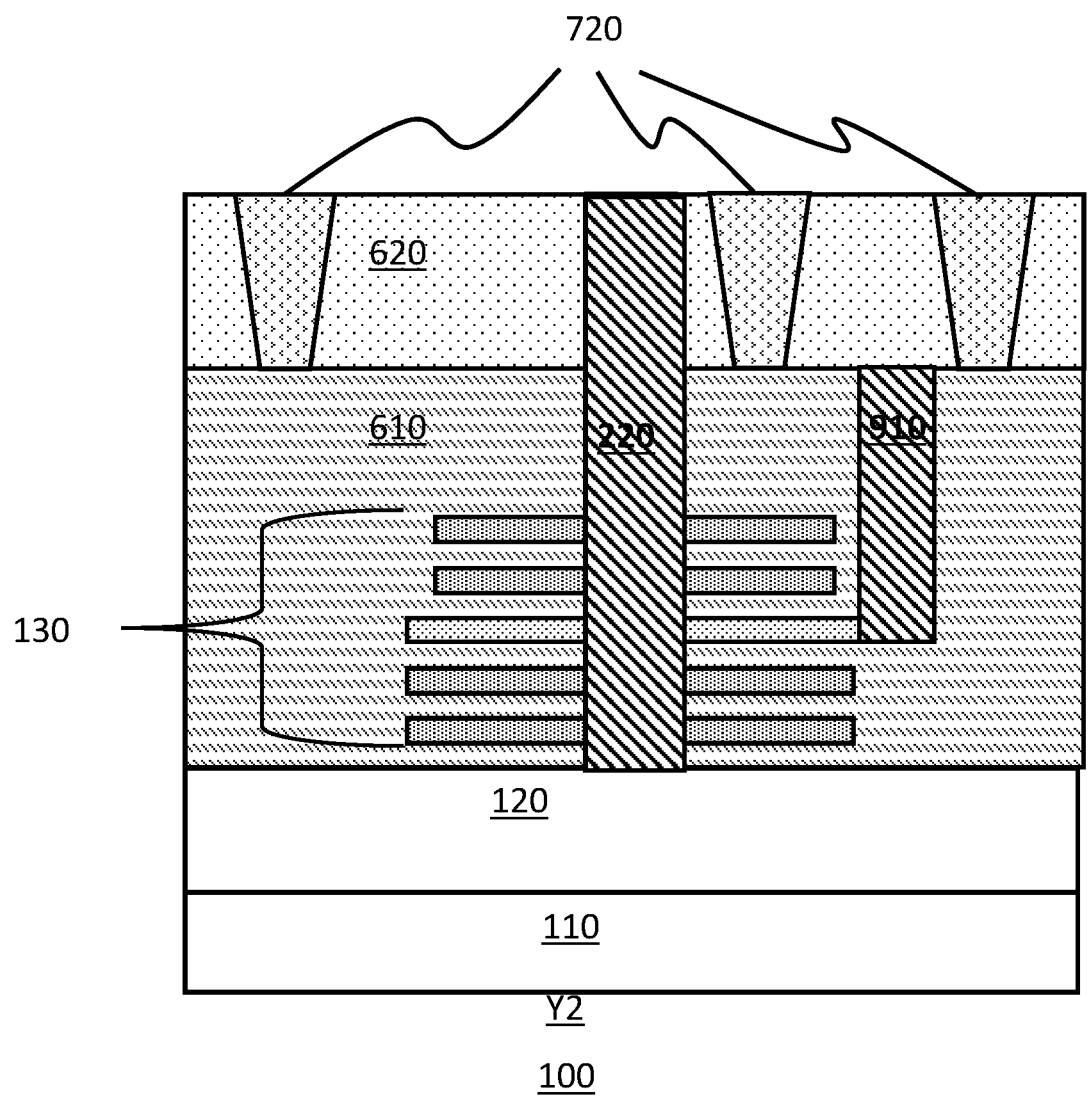
FIG. 10 provides a cross-sectional view of a step in the fabrication of a semiconductor device, according to an embodiment of the invention. The figure illustrates the device after the formation of independent gate contacts for a CFET/CFET device combination.

FIG. 10 illustrates a sectional view of device 100 along section line Y2, of FIG. 1, of a third embodiment of device 100. This section line is taken through the HKMG portion of the device. As shown in the Figure, gate contacts 710, fill vias through protective cap material 620, to connect with HKMG material 610. Channel nanosheets 130 form upper and lower FET devices above and below spacer layer 150. Two pairs of CMOS nFET/pFET stacks are formed, separated by dielectric spacer 220 of the device. The CMOS pair on the left share a common gate contact 710. The nFET and pFET on the right each have an independent gate contact 710. The two contacts separated by dielectric spacer 910 filling a via through gate metal 610 to contact spacer layer 150 of device 100.

Figure 11:
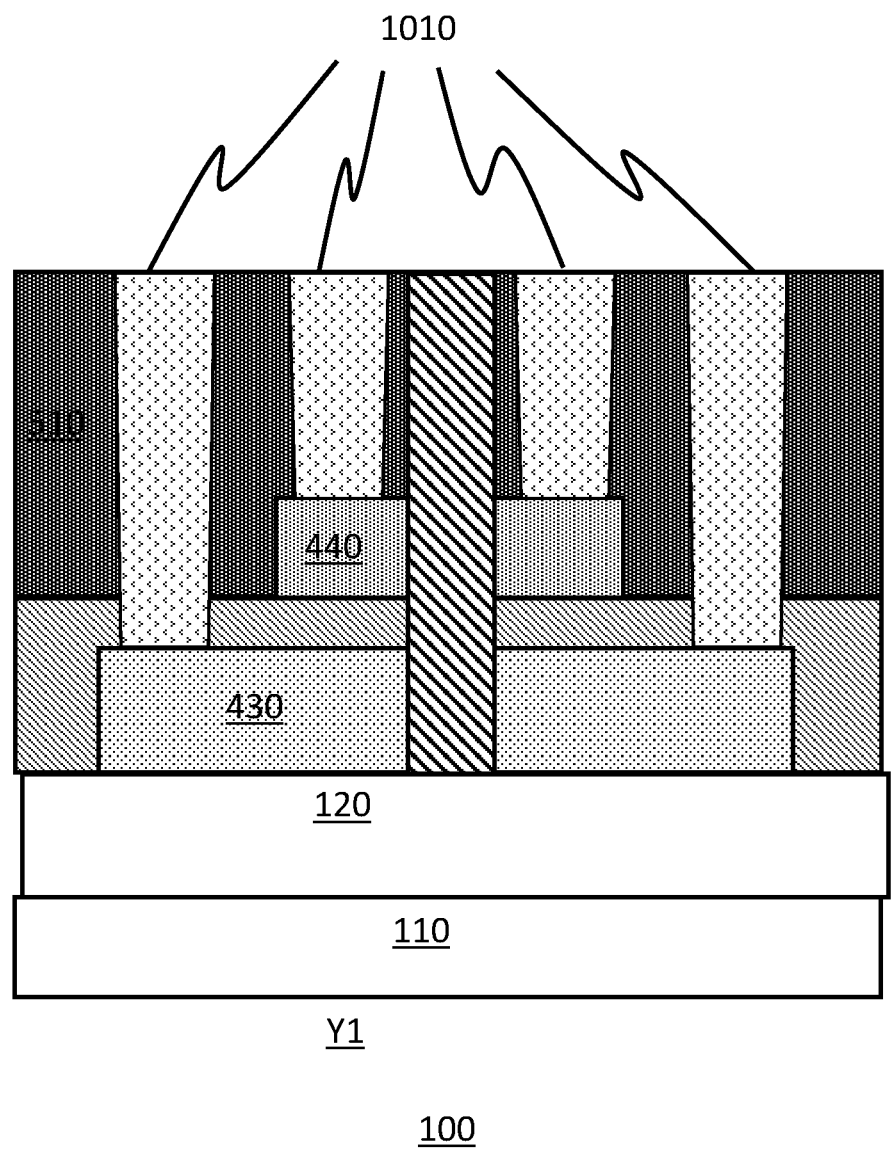
FIG. 11 provides a cross-sectional view of a step in the fabrication of a semiconductor device, according to an embodiment of the invention. The figure illustrates the device after the formation of source/drain contacts.

FIG. 11 provides a cross sectional view of device 100 along section line Y1 of FIG. 1. As shown in the Figure, upper source/drain contacts 1010, connect to the upper and lower source/drain regions of the pFET/nFET CMOS pairs on each of the right and left sides of device 100. Upper S/D contact 1010 are formed through the deposition of metal in vias etched through ILD 510 to the respective upper surfaces of S/D regions 430 and 440, of the upper and lower FET devices.

Figure 12:
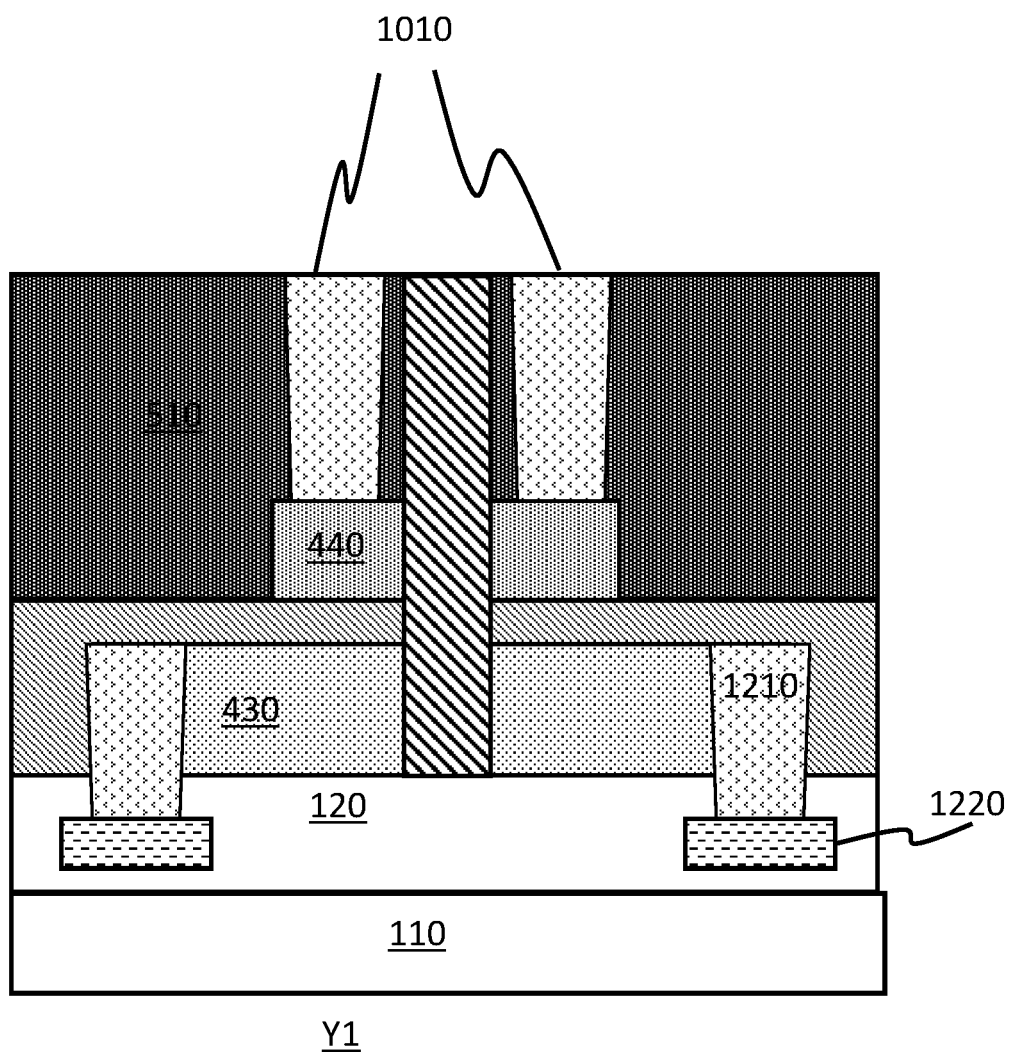
FIG. 12 provides a cross-sectional view of a step in the fabrication of a semiconductor device, according to an embodiment of the invention. The figure illustrates the device after the formation of source/drain contacts.

FIG. 12 provides a cross sectional view of device 100 along section line Y1 of FIG. 1. As shown in the Figure, upper source/drain contacts 1010, connect to the source/drain regions of the upper FET of the CMOS pairs on each of the right and left sides of device 100. Upper S/D contact 1010 are formed through the deposition of metal in vias etched through ILD 510 to the respective upper surfaces of S/D regions 430 and 440, of the upper and lower FET devices. As shown in the Figure, lower S/D contacts 1210 connect the S/D regions of the lower FETs of the CMOS pairs on each side of the dielectric spacer 220, to buried power rails 1220 beneath the CMOS pairs. Such lower contacts are formed at an early stage of fabrication, following epitaxial growth of the lower S/D regions, and prior to epitaxial growth of the upper S/D regions. Buried power rails 1220 are formed in conjunction with the formation of isolation layer 120.

Figure 13:
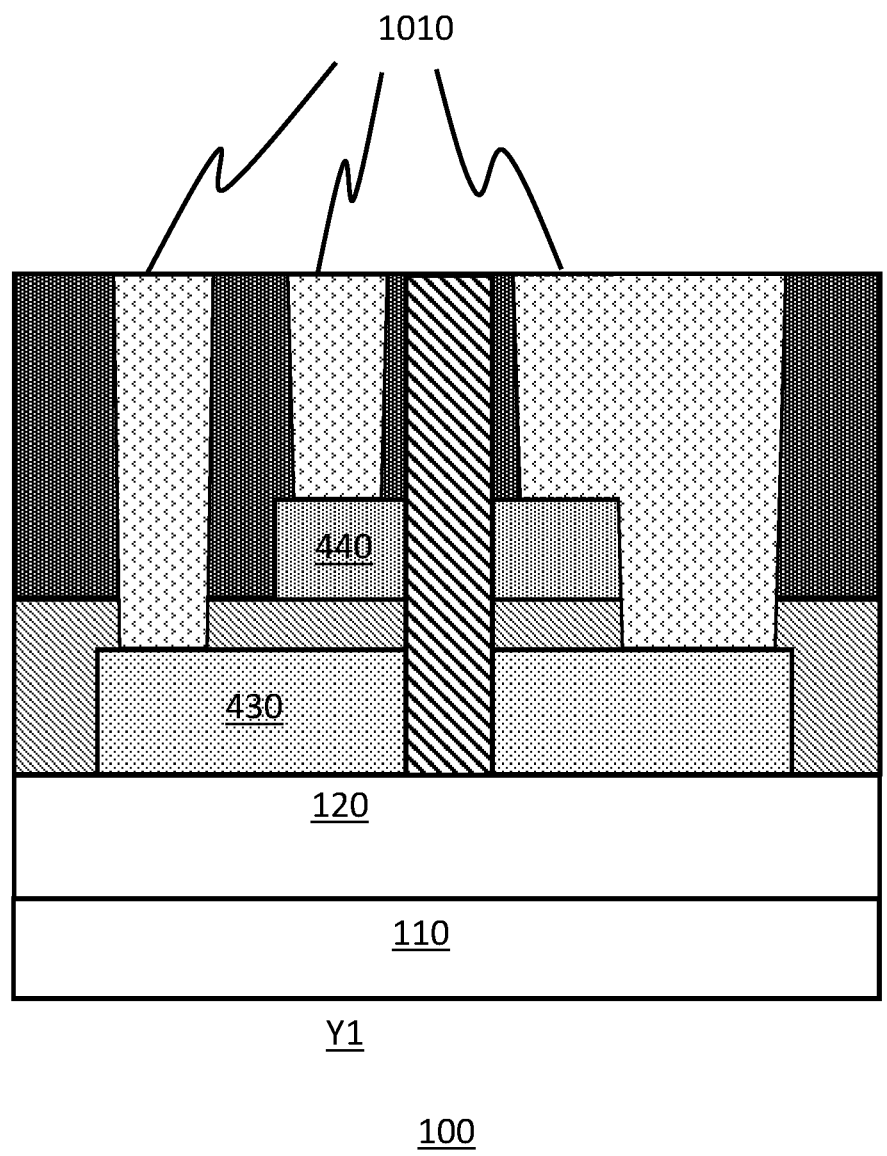
FIG. 13 provides a cross-sectional view of a step in the fabrication of a semiconductor device, according to an embodiment of the invention. The figure illustrates the device after the formation of source/drain contacts.

FIG. 13 provides a cross sectional view of device 100 along section line Y1 of FIG. 1. As shown in the Figure, upper source/drain contacts 1010, connect to the upper and lower source/drain regions of the pFET/nFET CMOS pairs on each of the right and left sides of device 100. Upper S/D contact 1010 are formed through the deposition of metal in vias etched through ILD 510 to the respective upper surfaces of S/D regions 430 and 440, of the upper and lower FET devices. As shown in the Figure, the CMOS pair of FET devices on the left have independent S/D contacts 1010, while the CMOS pair of FET devices on the right share a common S/D contact 1010.

Embodiments of the invention include combinations of the contacts illustrated for the respective portions of the CMOS pairs in FIGS. 8-13.

Figure 14:
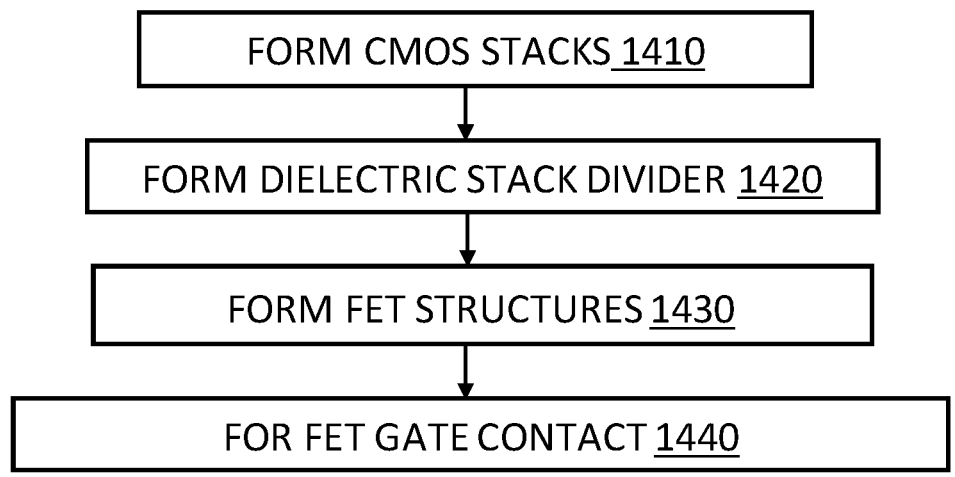
FIG. 14 provides a flowchart depicting operational steps for forming semiconductor device, according to an embodiment of the invention.

FIG. 14 provides a flowchart setting forth representative steps in the fabrication of devices, according to an embodiment of the invention. As shown in flowchart 1400, at block 1410, CMOS stacks of alternating channel and sacrificial layers are grown upon an underlying semiconductor substrate. The layer stacks are covered by a protective hard mask and patterned to a cross-section associated with the desired CMOS devices. The layer stacks include layers which ultimately form the channel layers and sacrificial layers for each of a lower and upper FET device. The upper and lower sets of layers are separated by an additional sacrificial layer which differs from the upper or lower sacrificial layers.

At block 1420, a dielectric stack divider is formed through the stacks, separating each stack into two sets of stacked layers, corresponding to the CMOS devices ultimately formed upon first and second sides of the dielectric spacer/divider.

At block 1430, the FET structures are formed. Dummy gate structures including insulating sidewalls are formed, upper and lower source/drain regions are epitaxially grown and etched back to desired sizes. The S/D regions are encapsulated with an insulating interlayer dielectric. The dummy gates are then replaced with high-k metal gate structures.

At block 1440, the contacts for the devices are formed. Gate contacts as well as S/D contacts are formed for the FET devices forming the CMOS pairs as well as any single FET devices formed adjacent to the dielectric spacer of the overall device. Gate contacts and S/D contacts may be common or independent contacts. In an embodiment, common gate contacts are formed for one CMOS FET pair and independent gate contacts are formed for the other CMOS FET pair. In an embodiment, common gate contacts are formed for both CMOS FET pairs.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A complementary metal-oxide semiconductor (CMOS) device comprising:
    a stacked pair of nanosheet field effect transistors (FET), the stacked pair comprising a first nanosheet device disposed above a second nanosheet device, each nanosheet device comprising at least one semiconductor channel, wherein the stacked pair share a single gate contact;
    a dielectric spacer disposed in direct contact with an edge of the semiconductor channels of the stacked pair;
    a third FET disposed in direct contact with the dielectric spacer and opposite to the stacked pair; and
    a fourth FET disposed above the third FET, the fourth FET disposed in direct contact with the dielectric spacer, wherein the third FET and the fourth FET share a single gate contact.

2. The CMOS device according to claim 1, wherein the third FET comprises an nFET.

3. The CMOS device according to claim 1, wherein at least one FET comprises a lower source/drain contact with a buried power rail.

4. The CMOS device according to claim 1 wherein the stacked pair have independent gate contacts.

5. A complementary metal-oxide semiconductor (CMOS) device comprising:
    a stacked pair of CMOS field effect transistors (FET), the stacked pair comprising independent source/drain contacts and semiconductor channels;
    a dielectric spacer disposed in direct contact with an edge of the semiconductor channels of the stacked pair;
    a third FET disposed in direct contact with the dielectric spacer and opposite to the stacked pair; and
    a fourth FET disposed above the third FET, the fourth FET disposed in direct contact with the dielectric spacer, wherein the third FET and the fourth FET share a single gate contact.

6. The CMOS device according to claim 5, wherein the independent source/drain contacts comprise upper contacts.

7. The CMOS device according to claim 5, wherein at least one independent contact comprises a lower contact to a buried power rail.

8. The CMOS device according to claim 5, wherein the stacked pair have independent gate contacts.

* * * * *